United States Patent
Liu et al.

(10) Patent No.: US 12,157,385 B2
(45) Date of Patent: Dec. 3, 2024

(54) CHARGING STATE ANALYSIS METHOD FOR ELECTRIC VEHICLE BASED ON ELECTRICAL CHARACTERISTIC SEQUENCE ANALYSIS

(71) Applicant: Guizhou Power Grid Company Limited, Guiyang (CN)

(72) Inventors: Bin Liu, Guiyang (CN); Zhukui Tan, Guiyang (CN); Qiuyan Zhang, Guiyang (CN); Saiqiu Tang, Guiyang (CN); Xia Yan, Guiyang (CN); Rong Chen, Guiyang (CN); Yu Shen, Guiyang (CN); Hai Zhou, Guiyang (CN); Peng Zeng, Guiyang (CN); Canhua Wang, Guiyang (CN); Chenghui Lin, Guiyang (CN); Mian Wang, Guiyang (CN); Jipu Gao, Guiyang (CN); Meimei Xu, Guiyang (CN); Zhaoting Ren, Guiyang (CN); Cheng Yang, Guiyang (CN); Dunhui Chen, Guiyang (CN); Houyi Zhang, Guiyang (CN); Xinzhuo Li, Guiyang (CN); Qihui Feng, Guiyang (CN); Yutao Xu, Guiyang (CN); Li Zhang, Guiyang (CN); Bowen Li, Guiyang (CN); Jianyang Zhu, Guiyang (CN); Junjie Zhang, Guiyang (CN)

(73) Assignee: Guizhou Power Grid Company Limited, Guiyang (CN)

(*) Notice: Subject to any disclaimer, the term of this patent is extended or adjusted under 35 U.S.C. 154(b) by 281 days.

(21) Appl. No.: 17/786,547

(22) PCT Filed: Jan. 19, 2021

(86) PCT No.: PCT/CN2021/072731
§ 371 (c)(1),
(2) Date: Jun. 17, 2022

(87) PCT Pub. No.: WO2022/155791
PCT Pub. Date: Jul. 28, 2022

(65) Prior Publication Data
US 2023/0241993 A1    Aug. 3, 2023

(51) Int. Cl.
*B60L 53/62* (2019.01)
*G06N 3/04* (2023.01)
*G06N 3/08* (2023.01)

(52) U.S. Cl.
CPC ............... *B60L 53/62* (2019.02); *G06N 3/04* (2013.01); *G06N 3/08* (2013.01)

(58) Field of Classification Search
CPC . B60L 53/62; G06N 3/04; G06N 3/08; G06N 3/044
See application file for complete search history.

(56) References Cited

U.S. PATENT DOCUMENTS 10,322,641 B2 * 6/2019 Tani ..................... B60L 3/0046
10,367,354 B2   7/2019 Tyler et al.

FOREIGN PATENT DOCUMENTS

CN        202586432 U    12/2012
CN        206938504 U     1/2018
(Continued)

OTHER PUBLICATIONS

FIT translation (Year: 2021).*
FIT translation (Year: 2023).*
International Search Report and Written Opinion of the corresponding PCT application No. PCT/CN2021/072731 mailed on Sep. 28, 2021.

*Primary Examiner* — Huan Le
(74) *Attorney, Agent, or Firm* — IDEA Intellectual Limited; Margaret A. Burke; Sam T. Yip

(57) ABSTRACT

A charging state analysis method of an electric vehicle based on electrical characteristic sequence analysis is provided. The method includes following steps: step S1, obtaining
(Continued)

voltage sampling data and current sampling data of the electric vehicle during charging; step S2, setting a time interval, so as to divide the voltage sample data and the current sampling data obtained in step S1 into multiple data sets; step S3, calculating an electrical characteristic vector of each time interval; step S4. adding the calculation results of Step S3 to a temperature sensing value T, and generate an electrical characteristic sequence of whole charging cycle; step S5, inputting the electrical characteristic sequence of the electric vehicle into a trained TRNN in sequence to obtain corresponding results; if the result is 1, it is normal; if the result is 0, it is abnormal.

5 Claims, 1 Drawing Sheet

(56) References Cited

FOREIGN PATENT DOCUMENTS

| | | | | |
|---|---|---|---|---|
| CN | 108197073 | A | | 6/2018 |
| CN | 109760542 | A | | 5/2019 |
| CN | 110441594 | A | | 11/2019 |
| CN | 210866413 | U | | 6/2020 |
| CN | 111398820 | A | | 7/2020 |
| CN | 211391010 | U | | 9/2020 |
| CN | 109742579 | B | | 10/2020 |
| CN | 111884224 | A | | 11/2020 |
| CN | 112215434 | A | * | 1/2021 ............ G06Q 10/04 |
| CN | 116736164 | A | * | 9/2023 ........... G01R 31/392 |

* cited by examiner

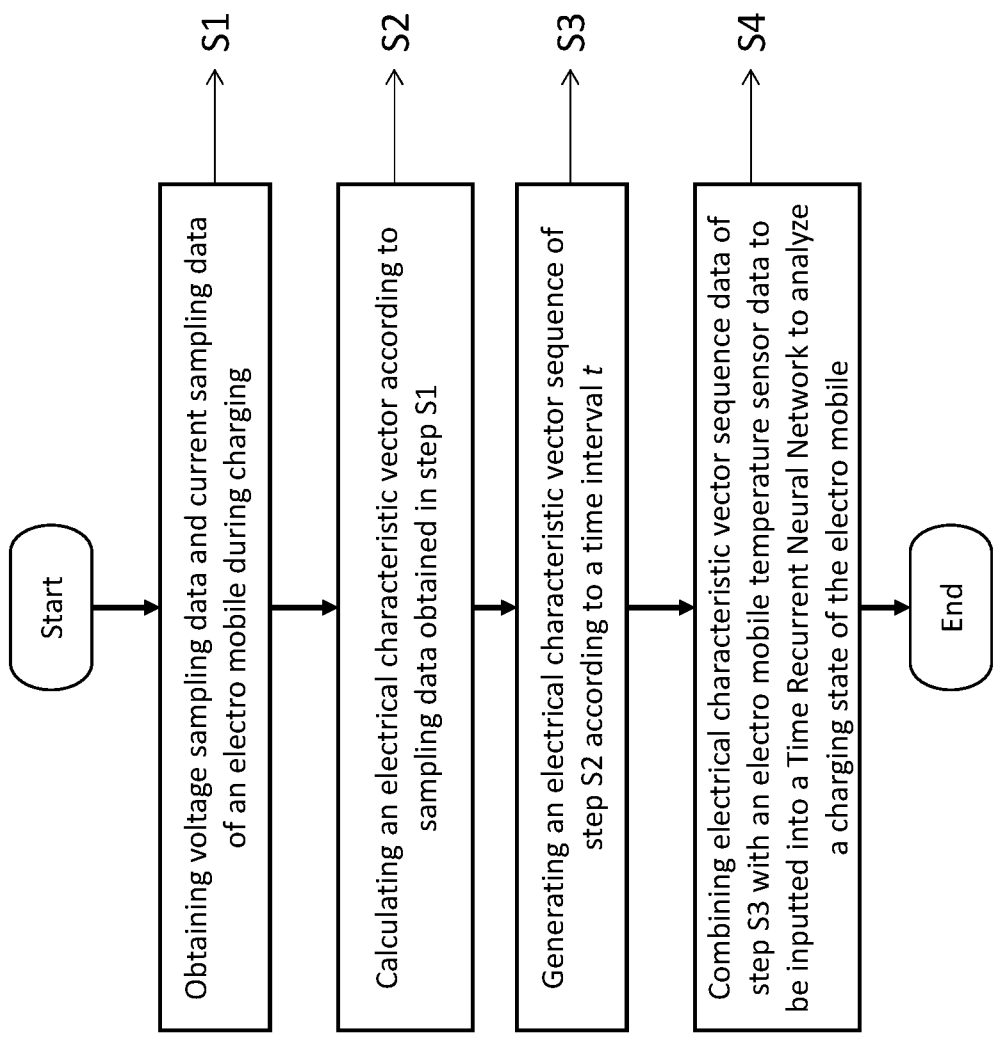

CHARGING STATE ANALYSIS METHOD FOR ELECTRIC VEHICLE BASED ON ELECTRICAL CHARACTERISTIC SEQUENCE ANALYSIS

FIELD OF THE INVENTION

The invention relates to a charging state analysis method of electric vehicle based on electrical characteristic sequence analysis, belonging to the technical field of electric vehicle charging.

BACKGROUND OF THE INVENTION

With the popularity of electric vehicle, more and more people use electric vehicle to travel, uneven battery quality lead to electric vehicle charging accidents frequently, such that how to achieve electric vehicle charging state monitoring through technical means is a popular issue at present. However, no one has proposed an analysis method of electric vehicle charging state, only the design method for electric vehicle charging device. For example, a Chinese patent application (Publication NO. CN202586432U) proposed a monitoring and control system of electric vehicles with charging protection, the system contains voltage and current detection unit; a Chinese patent application (Publication NO. CN210866413U) proposed a monitoring and protection of electric vehicle charging device, and the monitoring device can measure the deformation of the battery; a Chinese patent application (Publication NO. CN109742579B) proposed the electric vehicle charging socket of fireproof and theftproof system, added a temperature sensor in the electric vehicle charging socket. The foregoing Chinese patent applications can monitor the external data during the electric vehicle charging, but lack ability to determine whether the charging state of the electric vehicle is normal or abnormal (such as, battery leakage, charging short circuit, overvoltage charging and so on).

SUMMARY OF THE INVENTION

The technical problems to be solved are as follows: in order to solve technical problems existing in the existing technology, a charging state analysis method for an electric vehicle based on electrical characteristic sequence analysis is provided, based on Recurrent Neural Network (RNN) method, analyzing the variation of several kinds of electrical characteristics during electric vehicle charging, so as to know the state of the electric vehicle charging, such that abnormal state can be discovered earlier, and electrical fire occurred by failure can be prevented.

The technical scheme of the invention is as follows:

A charging state analysis method for an electric vehicle based on electrical characteristic sequence analysis, comprising following steps: step S1, obtaining voltage sampling data and current sampling data of the electric vehicle during charging; step S2, setting a time interval, so as to divide the voltage sample data and the current sampling data obtained in step S1 into multiple data sets; step S3, calculating an electrical characteristic vector of each time interval; step S4, adding the calculation results of Step S3 to a temperature sensing value T, and generate an electrical characteristic sequence of whole charging cycle; and step S5, inputting the electrical characteristic sequence of the electric vehicle into a trained Time Recurrent Neural Network (TRNN) in sequence to obtain corresponding results, if one of the results is 1, that said one of the results indicates that a charging state of the electric vehicle is normal; and if one of the results is 0, that said one of the results indicates that a charging state of the electric vehicle is abnormal.

The voltage sampling data and the current sampling data obtained in step S1 are high-frequency raw sampling data or low-frequency amplitude sampling data.

The voltage sampling data and the current sampling data obtained in step S1 are substituted as a further current sampling data.

The electrical characteristic vector calculated in step S2 comprises one or more of followings: active power P, reactive power Q, apparent power S, power factor $\varphi$, voltage harmonic $U_i$, current harmonic $I_i$, wherein the voltage harmonic $U_i$ and the current harmonic $I_L$ are calculated by performing fast Fourier transform (FFT) on the voltage sampling data and the current sampling data obtained in step S1, wherein the voltage harmonic $U_i$ and the current harmonic $I_i$ are in a vector form, and i is from 0 to 11 or more.

The Time Recurrent Neural Network (TRNN) in step S4 adopts a method or a modified method of followings: the Recurrent Neural Network (RNN), Long Short-Term Memory Neural Network (LSTM), or Gated Recurrent Unit (GRU).

The beneficial effect of the invention: compared with the conventional temperature monitoring for the electric vehicle, the invention analyzes the charging state of the electric vehicle by using electrical monitoring, so as to quickly find the abnormal of the electric vehicle charging. In addition, historical data and time sequence changes are considered in the electrical characteristic sequence analysis, so as to improve the accuracy of state analysis.

BRIEF DESCRIPTION OF THE DRAWINGS

FIG. 1 is a flowchart of the invention.

DETAILED DESCRIPTION

The invention is further introduced in combination with the drawings and specific embodiments.

Embodiment 1: as illustrated as FIG. 1, A charging state analysis method for an electric vehicle based on electrical characteristic sequence analysis, comprising:

Step S1, collecting voltage data and current data of the electric vehicle during charging through a smart socket. The sampling frequency of the smart socket is 6.4 khz/s, and the sampling accuracy is 0.5 level. The collecting time is from the start of the charging to the end of the charging, and the collecting time assumed as 7200 seconds but not limited hereto.

Step S2, setting the time interval as 1 second, then dividing the voltage sampling data and current sampling data obtained in step S1 into 7200 data sets.

Step S3, performing Fast Fourier transform algorithm (FFT) calculation on the voltage sampling data and the current sampling data of every is obtained in step S2, so as to obtain 0 to $11^{th}$ harmonic $U_i$ of voltage and 0 to $11^{th}$ harmonic Ii of current, and calculating active power $P_i$ of each harmonic successively:

$$P_i = U_i I_i$$

Wherein, $U_i$ is an amplitude of harmonic voltage of order i, and $I_i$ is an amplitude of harmonic current of order i. The total active power P is obtained by summing the active power of each harmonic:

$$P = \Sigma_{i=0}^{11} P_i$$

Then, calculating apparent power S, reactive power Q and power factor cos θ according to the Root Mean Square (RMS) value of the voltage and the current.

$$S = UI$$
$$Q = \sqrt{S^2 - P^2}$$
$$\cos \phi = \frac{P}{S}$$

Where U and I are voltage RMS value and current RMS value respectively. Then, the characteristics calculated every is are: active power P, apparent power S, reactive power Q and power factor cos Ø, 0 to $11^{th}$ harmonic voltage Hv, 0 to $11^{th}$ harmonic current $H_C$.

Step S4, adding the calculated results of step S3 to the temperature sensing value T to construct the characteristic vector V:

$$V=[P,S,Q,\cos \phi, U_1, \ldots, U_{11}, I_1, \ldots, I_{11}, T]$$

This vector has length 29. Then, the electrical characteristic sequence of the whole charging cycle can be expressed as:

$$[V^1, V^2, \ldots, V^{7200}]$$

Where $V^1$ represents the characteristic vector of the $1^{st}$ second, $V^2$ represents the characteristic vector of the $2^{nd}$ second, and $V^{7200}$ represents the characteristic vector of the $7200^{th}$ second.

Step 5, inputting the electrical characteristic sequence $[V^1, V^2, \ldots, V^{7200}]$ of the electric vehicle into trained Time Recurrent Neural Network (TRNN) in sequence to obtain corresponding results $[R^1, R^2, \ldots, R^{7200}]$. If $R^i=1$, it indicates that the electric vehicle's charging state in the $i^{th}$ second is normal. If $R^i=0$, it indicates that the electric vehicle's charging state in the $i^{th}$ second is abnormal (e.g., battery leakage, charging short circuit, overvoltage charging, etc.).

Through the above steps, the charging state of the electric vehicle can be analyzed in real time according to the electric monitoring quantity of the electric vehicle, such that an abnormal charging state can be found in time, and the explosion and fire of the electric vehicle can be prevented.

The concept of the charging state analysis method for an electric vehicle based on electrical characteristic sequence analysis provided by the invention is that charging states of the electric vehicle during charging can be reflected by the voltage and current of the power supply port, once the electric vehicle has the abnormal state, the abnormal state can be quickly reflected through electric monitoring quantity, and the recorded electrical characteristics sequence is utilized to quickly analyze where is the problem. The existing monitoring means such as temperature and deformation monitoring only respond when the electric vehicle changes violently, such as high temperature and deformation. When the electric vehicle occurs this kind of situation, the electric vehicle often enters a very dangerous state, it may happen explosion or electrical fire at any time.

Based on above, only for the specific implementation of the present invention, but the protection scope of the present invention is not limited hereto, any familiar with this technology in the field of technical personnel in the present invention disclosed, within the limits of technology can easily think of change or replace, should be covered within the scope of protection of the present invention, therefore, the protection range of the present invention should be referred to the extent of protection of the right to request shall prevail.

What is claimed is:

1. A charging state analysis method for an electric vehicle based on electrical characteristic sequence analysis, comprising following steps:

step S1, obtaining voltage sampling data and current sampling data of the electric vehicle during charging;

step S2, setting a time interval, so as to divide the voltage sample data and the current sampling data obtained in step S1 into multiple data sets;

step S3, calculating an electrical characteristic vector of each time interval;

step S4, adding the calculation results of Step S3 to a temperature sensing value T, and generate an electrical characteristic sequence of whole charging cycle; and step S5, inputting the electrical characteristic sequence of the electric vehicle into a trained Time Recurrent Neural Network (TRNN) in sequence to obtain corresponding results, if one of the results is 1, that said one of the results indicates that a charging state of the electric vehicle is normal; and if one of the results is 0, that said one of the results indicates that a charging state of the electric vehicle is abnormal.

2. The charging state analysis method for the electric vehicle based on electrical characteristic sequence analysis of claim 1, wherein the voltage sampling data and the current sampling data obtained in step S1 are high-frequency raw sampling data or low-frequency amplitude sampling data.

3. The charging state analysis method for the electric vehicle based on electrical characteristic sequence analysis of claim 1, wherein the voltage sampling data and the current sampling data obtained in step S1 are substituted as a further current sampling data.

4. The charging state analysis method for the electric vehicle based on electrical characteristic sequence analysis of claim 1, wherein the electrical characteristic vector calculated in step S2 comprises one or more of followings: active power P, reactive power Q, apparent power S, power factor φ, voltage harmonic $U_i$, current harmonic $I_i$, wherein the voltage harmonic $U_i$ and the current harmonic $I_i$ are calculated by performing fast Fourier transform (FFT) on the voltage sampling data and the current sampling data obtained in step S1, wherein the voltage harmonic $U_i$ and the current harmonic $I_i$ are in a vector form, and i is from 0 to 11.

5. The charging state analysis method for the electric vehicle based on electrical characteristic sequence analysis of claim 1, wherein the Time Recurrent Neural Network (TRNN) in step S4 adopts a method or a modified method of the following: Recurrent Neural Network (RNN), Long Short-Term Memory Neural Network (LSTM), or Gated Recurrent Unit (GRU).

* * * * *